(12) United States Patent
Sandhu

(10) Patent No.: US 9,368,444 B2
(45) Date of Patent: Jun. 14, 2016

(54) SELF-ALIGNED NANO-STRUCTURES

(71) Applicant: Micron Technology, Inc., Boise, ID (US)

(72) Inventor: Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/586,412

(22) Filed: Dec. 30, 2014

(65) Prior Publication Data

US 2015/0108658 A1    Apr. 23, 2015

Related U.S. Application Data

(60) Division of application No. 13/526,225, filed on Jun. 18, 2012, now Pat. No. 8,946,907, which is a division of application No. 12/880,984, filed on Sep. 13, 2010, now Pat. No. 8,202,804, which is a continuation of application No. 11/431,269, filed on May 10, 2006, now Pat. No. 7,795,152.

(51) Int. Cl.
| | |
|---|---|
| *H01L 23/52* | (2006.01) |
| *H01L 23/522* | (2006.01) |
| *H01L 21/033* | (2006.01) |
| *H01L 21/311* | (2006.01) |

(52) U.S. Cl.
CPC ........ *H01L 23/5226* (2013.01); *H01L 21/0337* (2013.01); *H01L 21/31144* (2013.01); *H01L 2924/0002* (2013.01)

(58) Field of Classification Search
CPC ............... H01L 23/5226; H01L 21/76807; H01L 23/5283
See application file for complete search history.

(56) References Cited

U.S. PATENT DOCUMENTS

| | | | |
|---|---|---|---|
| 4,847,214 A | 7/1989 | Robb et al. | |
| 5,662,788 A | 9/1997 | Sandhu et al. | |
| 5,681,773 A | 10/1997 | Tseng | |
| 5,719,089 A | 2/1998 | Cherng et al. | |
| 5,882,535 A | 3/1999 | Stocks et al. | |
| 5,932,491 A | 8/1999 | Wald et al. | |
| 6,025,276 A | 2/2000 | Donohoe et al. | |
| 6,103,588 A | 8/2000 | Jeng et al. | |
| 6,147,005 A | 11/2000 | Tu et al. | |
| 6,171,952 B1 | 1/2001 | Sandhu et al. | |
| 6,184,128 B1 * | 2/2001 | Wang ................ | H01L 21/31144 257/E21.257 |
| 6,191,042 B1 | 2/2001 | Tsai et al. | |
| 6,245,641 B1 * | 6/2001 | Shiozawa .......... | H01L 21/76229 257/E21.279 |
| 6,365,508 B1 * | 4/2002 | Zhou ................. | H01L 21/76807 257/E21.579 |
| 6,440,847 B1 | 8/2002 | Lou | |
| 6,486,070 B1 | 11/2002 | Ho et al. | |
| 6,562,696 B1 | 5/2003 | Hsu et al. | |

(Continued)

FOREIGN PATENT DOCUMENTS

JP    WO 2006016678 A1 *   2/2006   ...... H01L 21/76877

*Primary Examiner* — Michele Fan
(74) *Attorney, Agent, or Firm* — Fletcher Yoder, P.C.

(57) ABSTRACT

A method for creating structures in a semiconductor assembly is provided. The method includes etching apertures into a dielectric layer and applying a polymer layer over the dielectric layer. The polymer layer is applied uniformly and fills the apertures at different rates depending on the geometry of the apertures, or on the presence or absence of growth accelerating material. The polymer creates spacers for the etching of additional structure in between the spacers. The method is capable of achieving structures smaller than current lithography techniques.

14 Claims, 3 Drawing Sheets

(56) References Cited

U.S. PATENT DOCUMENTS

| | | |
|---|---|---|
| 6,605,509 B1 | 8/2003 | Hsieh |
| 6,617,253 B1 | 9/2003 | Chu et al. |
| 6,753,254 B2 | 6/2004 | Sandhu et al. |
| 7,148,142 B1 | 12/2006 | Dakshina-Murthy et al. |
| 7,238,619 B2 | 7/2007 | Zhou et al. |
| 7,276,442 B2 | 10/2007 | Sandhu et al. |
| 7,611,962 B2 | 11/2009 | Kwak |
| 2002/0182855 A1* | 12/2002 | Agarwala .......... H01L 21/76852 438/638 |
| 2002/0195709 A1 | 12/2002 | Sandhu et al. |
| 2003/0199169 A1 | 10/2003 | Jun et al. |
| 2004/0192003 A1 | 9/2004 | Sandhu et al. |
| 2004/0192058 A1 | 9/2004 | Chu et al. |
| 2004/0219743 A1 | 11/2004 | Fang et al. |
| 2005/0070090 A1* | 3/2005 | Lee .................. H01L 21/7684 438/629 |
| 2006/0160356 A1 | 7/2006 | Hwang |
| 2006/0202346 A1* | 9/2006 | Shih .................. H01L 23/53238 257/774 |
| 2006/0246718 A1 | 11/2006 | Frohberg et al. |

* cited by examiner

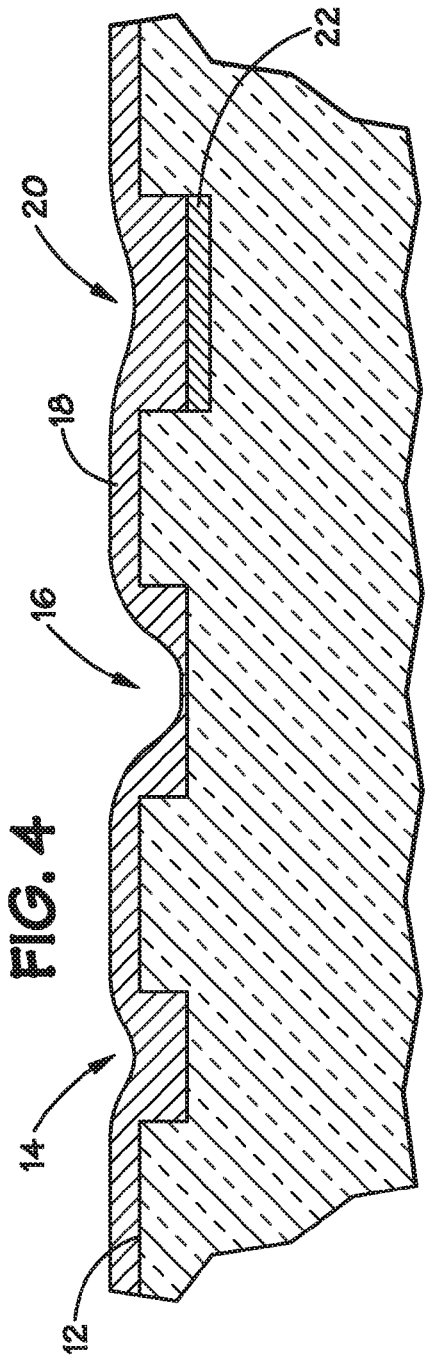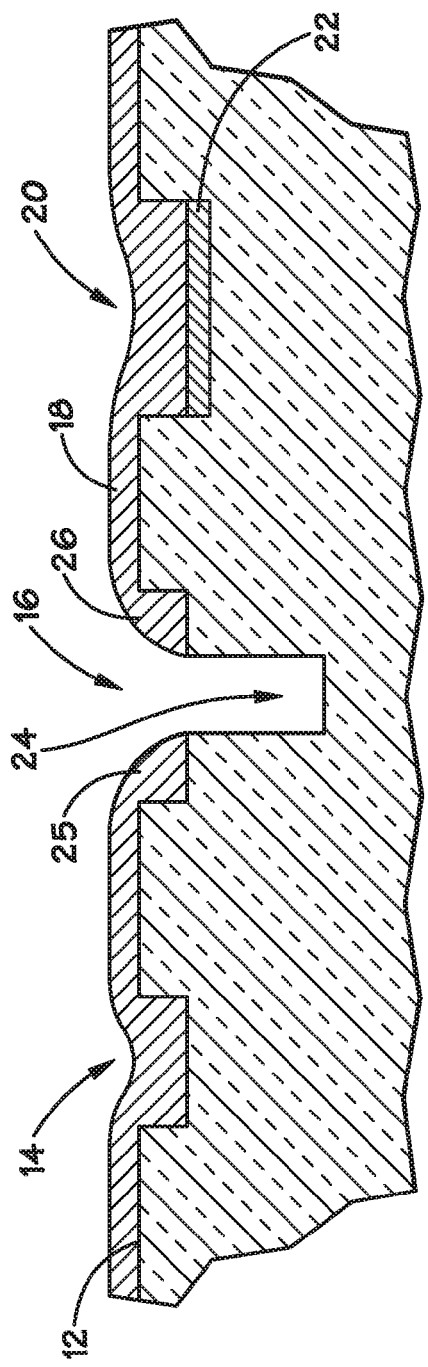

SELF-ALIGNED NANO-STRUCTURES

CROSS-REFERENCE TO RELATED APPLICATION

This application is a divisional of U.S. patent application Ser. No. 13/526,225, which was filed on Jun. 18, 2012, which is a divisional of U.S. patent application Ser. No. 12/880,984, which was filed on Sep. 13, 2010, now U.S. Pat. No. 8,202, 804, which issued on Jun. 19, 2012, which is a continuation of U.S. patent application Ser. No. 11/431,269, which was filed on May 10, 2006, now U.S. Pat. No. 7,795,152, which issued on Sep. 14, 2010.

TECHNICAL FIELD

The present invention relates generally to integrated circuits and, more particularly, to the manufacturing of integrated circuits.

BACKGROUND

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Integrated circuits can be found in virtually any electronic device. For example, integrated circuits such as microprocessors and digital memory chips are present in products such as computers, cell phones, and microwave ovens. Since their first introduction over a half century ago, integrated circuits have progressively become smaller and increasingly more densely populated. The increase in density provides numerous advantages, including the ability for smaller chips to perform the same functionality as larger chips. Additionally, the smaller size increases performance and reduces power consumption. Specifically, with smaller size, the electrical paths are shorter, allowing low power logic to be used at fast switching speeds. Achieving progressively smaller structure size on the chips, and thus producing smaller chips, has become increasingly difficult and costly due, at least in part, to reaching physical limitations of standard fabrication techniques. New and improved processes are constantly being proposed to further reduce cost as well as size.

Typically, the integrated circuit manufacturing process includes at least three main processes: 1) patterning; 2) adding materials; and 3) removing materials. The patterning process is primarily achieved by employing photolithography. Through the patterning process, various regions are defined that eventually serve as the components, such as transistors and traces, of the integrated circuit. The process of adding materials includes depositing or growing material on a substrate to create multiple layers. One layer typically included in an integrated circuit is a dielectric layer, which may be formed as an oxide. The process of removing material generally includes an etching process. It is through the etching process that material in regions defined by the pattern is removed to form various structures.

Etching may be performed in one of two methods: wet etching or dry etching. In dry etching, a plasma etchant is used to remove material in an anisotropic manner, meaning that the etching occurs in a single direction downward though the material. Even though the dry etching process is more costly than wet etching, it is more often employed due to the anisotropic etching characteristic. The anisotropic nature of dry etching allows for better resolution compared to that achievable through wet etching and consequently provides the ability to create smaller, well-defined structures. As discussed above, the smaller the geometries, the more efficient the integrated circuit may be.

Current techniques capable of achieving small-scale geometries include the 193 nm dry etch and the 193 nm emersion techniques. The 193 nm dry etch is capable of achieving geometries with a lower limit resolution of about 65 nm, while the 193 nm emersion technique is capable of achieving geometries with a lower limit resolution of about 45 nm. Yet another technique, the EUV technique, claims the capability of achieving even smaller geometries, although its lower limit remains unproven.

Disadvantageously, the above-mentioned techniques are relatively costly and are constrained by limits in resolution capability. The number of iterative steps required in integrated circuit manufacturing typically correlates directly with the cost of production. To create a single structure, for example, multiple photomasks may be necessary using conventional techniques. Specifically, to create a via or a hole, for example, a first photomask may be used to create a trench, and a second mask is employed to etch through the layer, within the trench to create the via. Each use of a new photomask requires the removal of the wafer from the etch chamber for the application of the new photomask, thus, increasing cost. Further, employing multiple masks increases the risk of misalignment which may result in fabrication defects.

BRIEF DESCRIPTION OF THE DRAWINGS

Certain exemplary embodiments are described in the following detailed description and in reference to the drawings in which:

FIG. 4 illustrates a cross-sectional view of the layer having multiple unique structures in accordance with embodiments of the present invention;

FIG. 5 illustrates a cross-sectional view of the layer having a via in accordance with embodiments of the present invention;

DETAILED DESCRIPTION

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 6:
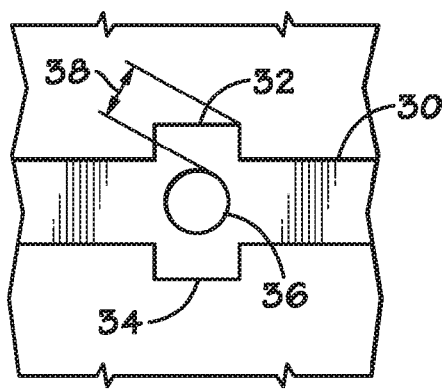
FIG. 6 illustrates a top view of an isolated trench in a layer of an integrated circuit in accordance with embodiments of the present invention.
Figure 7:
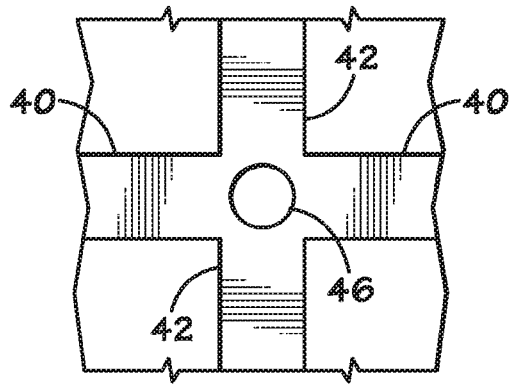
FIG. 7 illustrates a top view of an intersection of two trenches in a layer of an integrated circuit in accordance with embodiments of the present invention.
Figure 8:
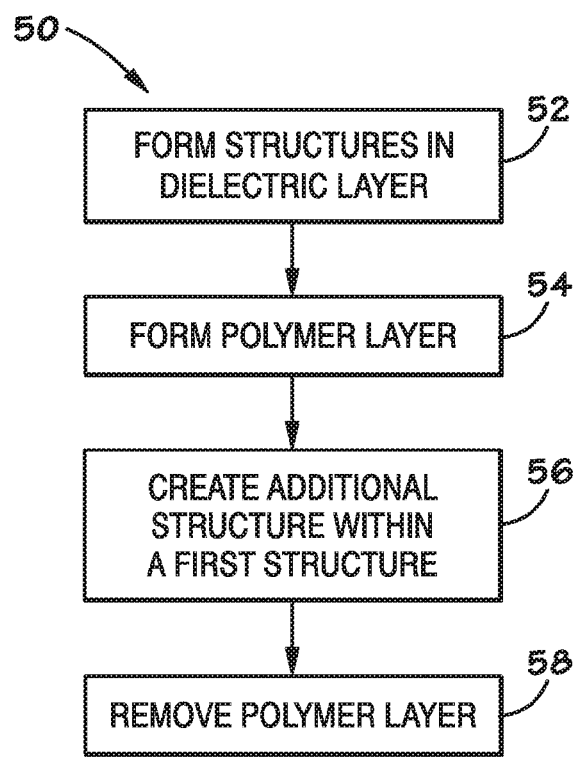
FIG. 8 is a flow chart illustrating a technique for creating structures in an layer from a single photomask in accordance with embodiments of the present invention.

A method for creating structures in apertures, such as trenches, in a semiconductor assembly is provided. The method includes forming a polymer layer on a dielectric layer to create spacers for a subsequent etching step. The method may be employed in creating additional structures that have narrower widths than the apertures, such as damascene structures, contact vias, or other structures. The method is capable of achieving better resolution and smaller features than current lithography techniques. Figures are included to aid in the description of exemplary embodiments. As described in greater detail below, FIGS. 1-7 show a dielectric layer having apertures and illustrate various techniques for creating additional structure in the apertures. FIG. 8 is a flowchart depicting an exemplary technique for implementing the disclosed methods.

Figure 1:
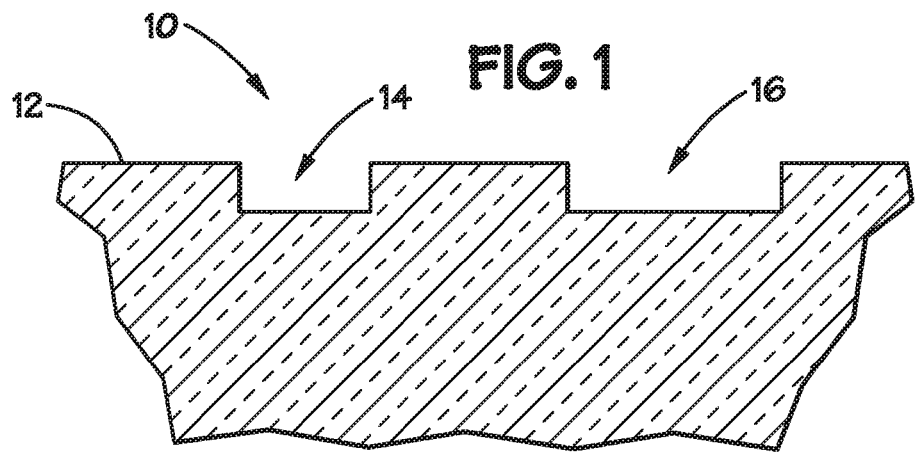
FIG. 1 illustrates a cross-sectional view of a layer of an integrated circuit in accordance with embodiments of the present invention.

The process of manufacturing integrated circuits involves the creation of unique structures in layers built on a substrate, such as a silicon substrate. Although traditional methods generally employ multiple photomasks, the structures can be made from a single photomask using the techniques and methods disclosed herein. FIG. 1 illustrates a cross-sectional view of a layer formed during the manufacturing process of an integrated circuit and is generally designated by the reference numeral 10. The layer 12 may be representative of any insulative or dielectric layer of an integrated circuit, such as an oxide layer, for example. The layer 12 may be grown or deposited directly on a wafer or substrate, such as silicon, or may be a layer disposed above other layers of the integrated circuit.

The layer 12 has first and second apertures formed therein. In one exemplary embodiment, the first aperture comprises a first trench 14 and the second aperture comprises a second trench 16. The trenches 14 and 16 have been patterned into the layer 12 through a photolithography process common in the art. Specifically, a photoresist and photomask have been used to define apertures in the layer 12 that will serve as structures in the integrated circuits, such as transistors and traces. As can be seen, the first trench 14 is narrower than the second trench 16. Typical layouts allow for some flexibility in the size of the trenches. As will be discussed in greater detail below, the relative trench widths will allow for the formation of various structures.

After the apertures (trenches 14 and 16) have been created in the layer 12, the photoresist and photomask may be removed. At this point, if additional structures are to be created in layer 12 (e.g. further pattering within the trenches), current techniques require the removal of the wafer from a processing chamber, for example a dry etch chamber, in order to apply another photomask. In the technique disclosed herein, however, the wafer does not need to be removed from the chamber in order to create additional structures in the layer 12. Rather, a polymer layer is applied in-situ which allows for further processing and the formation of additional structures without removing the wafer from the chamber or employing an additional photomask.

Figure 2:
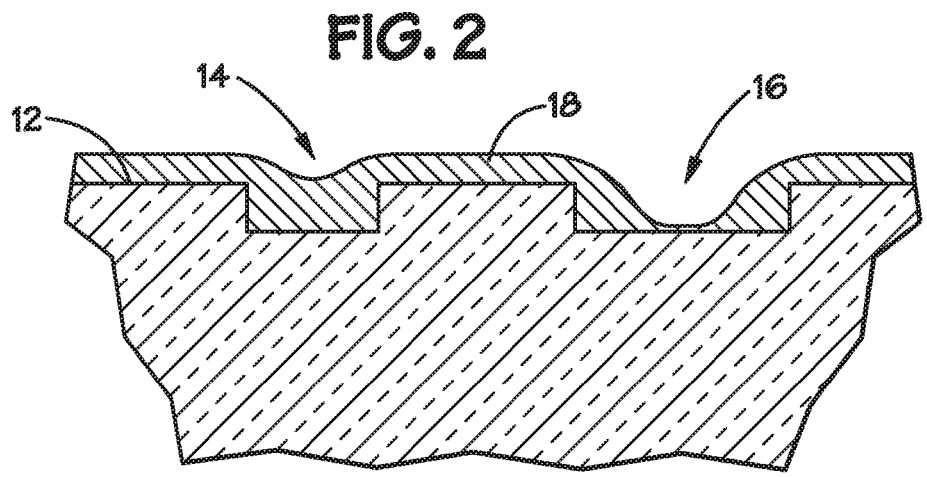
FIG. 2 illustrates a cross-sectional view of the layer of FIG. 1 after polymer deposition in accordance with embodiments of the present invention.

FIG. 2 illustrates a cross-sectional view of the layer 12 having a polymer layer 18 deposited over the layer 12 and the trenches 14 and 16. The polymer layer 18 may be deposited in any manner compatible with dry etch chambers. For example, a plasma chamber, such as a GMODE chamber from LAM may be used. The GMODE chamber uses multiple deposition and etching steps to deposit highly conformal polymer layers with controllable thickness into small nanometer-sized structures, such as the trenches 14 and 16.

The polymer layer 18 is applied in-situ after the dry etch process has created structures, such as trenches 14 and 16. The polymers used for the polymer deposition may be any polymer compatible with dry etch processes and may include those currently in use in such processes. As the polymer layer 18 is applied, the first trench 14 fills with the polymer while the second trench 16 remains relatively empty. This occurs because the first trench 14 is narrower than the second trench 16. As the polymer is applied to the first trench 14 in the plasma chamber, the polymer deposits along the side walls and grows inward from the sidewalls. Additionally, the polymer grows up from the bottom of the trench. The combined growth of the polymer from the bottom of the trench and the sidewalls of the trench cause the first trench 14 to fill with polymer. The second trench 16 likewise has polymer growth from the sidewalls and from the bottom. However, due to its wider geometry the second trench 16 does not fill with polymer like the first trench 14. Therefore, as illustrated in FIG. 2, the polymer 18 is deposited in the plasma chamber until the narrower trench 14 is filled completely, thereby leaving the wider trench 16 such that the center of the trench 16 is not completely filled with polymer 18. It should be noted that other methods and materials which allow for precise control, conformal deposition and etch selectivity in the formation of spacers and the subsequent formation of structures can also be used.

Figure 3:
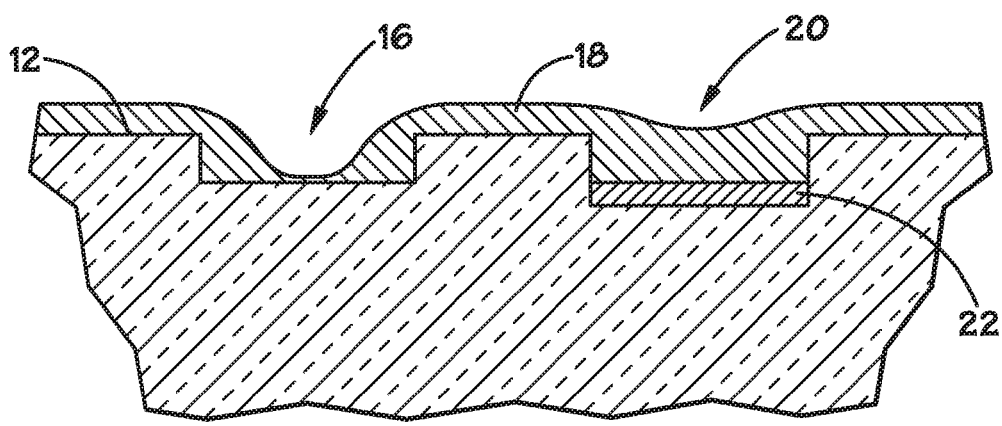
FIG. 3 illustrates a cross-sectional view of the layer with growth accelerating material in a trench after polymer deposition in accordance with embodiments of the present invention.

Other techniques or methods can be envisioned which achieve a similar result. FIG. 3 illustrates a cross-sectional view of the layer 12 with a third trench 20. The third trench 20 is shown having an additional layer of growth accelerating material 22. The growth accelerating material 22 may be any material other than that of the layer 12 which would cause the polymer to grow more rapidly than it does on the layer 12. For example, if the layer 12 is an oxide, silicon is an example of such a material that may be employer as growth accelerating material 22. The second trench 16 and the third trench 20 may be of equivalent or similar size, such that absent the growth accelerating material 22 the trenches would fill with polymer at the same rate. Thus, in the event that chip design mandates that the trenches have the same width, a method is provided to add structure (i.e. polymer growth) to fill one trench filling the other. As will be described in detail below, this condition may be useful to create vias and other structures within a trench without employing an additional photomasking step.

As can be seen in FIG. 4, the polymer deposition in the bottom of the second trench 16 is significantly thinner than that deposited in the bottom of the first trench 14 and the third trench 20. As noted earlier, the first trench 14 is significantly narrower than the second trench 16, while the third trench 20 is approximately the same size as the second trench 16 but includes a growth accelerating material 22 in the bottom of the trench 20. Both conditions (i.e. narrower trench or the use of growth acceleration material 22) will advantageously result in the filling of the trenches 14 and 20 before the filling of the trench 16. As described above, as polymer is deposited in the first trench 14, the polymer grows in an inward fashion from the sidewalls such that it fills quickly with the polymer, relative to the speed at which the polymer fills the second trench 16. The result is that the second trench 16 remains relatively empty at the center of the trench when compared to the first trench 14. In the case of the third trench 20, additional growth accelerating material 22 causes polymer to grow quicker in the third trench 20 than in the second trench 16. As described further below, the limited polymer 18 in the trench 16 will facilitate the formation of additional structures, such as contact vias, within the trench 16.

After the deposition of the polymer layer 18, the layer 12 may be subjected to an etching step to create additional structures, such as vias, in the layer 12. FIG. 5 illustrates a cross-sectional view of the layer 12 with a via, or a hole. The via 24 is formed through the bottom of the trench 16 to underlying layers of the integrated circuit (not shown), for example. The polymer layer 18 that has been deposited on top of the layer 12 and on the sidewalls of the trench 16 prevents other areas of the layer 12 from being etched. The application of the polymer layer 18 to the second trench 16 creates spacers 25 and 26 as the polymer grows inward from the sidewalls. The spacers 25 and 26 guide the etching through the bottom of the second trench 16. An additional polymer spacer etch may be necessary to punch through the thin layer of polymer 18 deposited at the bottom of trench 16. The polymer etch exposes the bottom of trench 16 without exposing other areas because the polymer layer 18 is much thinner at the bottom of trench 16 relative to trenches 12 and 20.

Thus, as described above, according to the present technique, additional structures, such as contact vias, may be created in apertures, such as trenches, based on the relative width of the aperture or based on the absence of growth accelerating material. Additional structures may also be formed in isolated trenches by etching the trench wider where the structure is to be placed, as shown in FIG. 6. For example, looking at FIG. 6, a top view of an isolated trench 30 is shown having sidewalls that have been etched away in order to make the trench 30 wider at a particular point. Specifically, sidewalls 32 and 34 are etched away to prevent the polymer from filling the trench where additional structure is to be created. When a polymer layer is deposited, as described above, the center most portion of the trench 30 where the sidewalls 32 and 34 are recessed will not be filled with polymer, while the rest of the trench will be, thus, facilitating the formation of the via 36.

The space created by recessing the sidewalls 32 and 34 help define the dimensions of the via 36. In the present exemplary embodiment, the diameter of the via 36 is approximately equal to two times the distance from the via 36 to the corner of any of the sidewalls 32 and 34. For example, the distance of the line 38 of FIG. 6 would be approximately ½ of the diameter of the via 36. The present technique allows for any size via to be created, depending only upon the width of the trench where the via is to be placed and the polymer growth conditions and formation. Additionally, the via can be formed in-situ without the need of an additional photomask, as described above.

According to the present methods, additional structures may also be formed at the intersection of two trenches. FIG. 7 illustrates a top view of the intersection of two trenches. At the intersection of a first trench 40 and a second trench 42, additional structure 46 has been formed. Specifically, the first trench 40 and second trench 42 are created using a photomask to define the trenches, a polymer layer is formed on the sidewalls of the trenches, and the additional structure 46 may be formed through an opening in the polymer layer located at the center of the intersection.

An additional aspect that should be mentioned is that the vias are self aligning. As explained earlier with reference to FIG. 4, the polymer deposition creates spacers in the trench where a via is to be created. The spacers help ensure that the via is created in exactly the center of the trench. The ability to control the polymer deposition, such that it is deposited evenly on the sidewalls of the trench creates spacers of the same size. The alignment of the via is important in order to have a proper connection between the layers of the circuit and thereby minimize alignment defects. Because the size of the via can easily be manipulated through the geometry of the trenches, virtually any size via or other structure is achievable. Accordingly, the present techniques may allow for the formation of smaller geometries and feature sizes of structures such as vias, than would otherwise be achievable through the use of photomasks alone.

Turning to FIG. 8, a flow chart of the present technique is illustrated and is generally designated by the reference numeral 50. The technique 50 begins by forming structures, such as trenches, recesses or apertures, in the layer, as indicated at block 52. The structures are formed using standard photolithography techniques including applying a photoresist layer and a photomask and using a dry etch process. The structures formed may include trenches having various widths, trenches with growth accelerating material, insolated trenches with recessed walls, or intersecting trenches, for example. After the structures are formed, a polymer layer is grown on top of the layer, as indicated at block 54. The polymer layer is applied uniformly across the surface of the layer and the structures. Due to the geometries of the various unique structures, or the presence of growth accelerating material at the bottom of the trenches, the polymer will grow and fill the trenches at different rates. For example, a narrower trench will fill quicker than a wider trench because the polymer will grow from the sidewalls of the trenches and will meet in the narrower trench first. Also, trenches with growth accelerating material will fill faster. The sidewall growth of the polymer in a wider trench serve as spacers for a spacer etch to create additional structure, such as a via, as indicated at block 56. Once the additional structure is created, the polymer layer may be removed using any standard means compatible with a dry etch process, such as cleaning organic, or solvent cleaning solution, as indicated at block 58.

The technique 50 may be used to achieve a combination of damascene microstructures smaller than what may be achieved by presently practiced techniques. For example, the present technique may be used to achieve geometries, such as via widths of less than 40 nm. As described above, the size of the via is relative to the original structure and the ability to control the deposition of polymer. With control of the growth of the polymer layer, any size hole may be achieved, thus, dependence on lithographic techniques is avoided and the size depends on how much polymer is deposited and how precisely the polymer may be deposited.

Additionally, the present technique eliminates an additional masking step to create the vias within the trenches. The technique 50 allows for multiple self-aligned nano patterns using in-situ polymer depositions and dry etching sequences. The cost of the process decreases as unique patterns may be achieved and vias may be formed without employing an additional photomask. Having the ability to perform the technique in-situ increases the efficiency of the process. Specifically, there is no need to remove a wafer from an etching chamber to apply another mask. A combination of damascene type structures may be achieved as well as small self-aligned contact holes into pitch multiplied structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor assembly comprising:
   a first aperture formed in a dielectric layer;
   a second aperture formed in the dielectric layer, parallel to the first aperture;
   an additional structure formed in the center and below the first aperture, wherein the additional structure is narrower than a width of the first aperture and wherein the additional structure has a width of approximately 45 nm or less; and
   a polymer layer formed in each of the first aperture and the second aperture, such that the first aperture is only partially filled with the polymer layer and the second aperture is completely filled with the polymer layer.

2. The semiconductor assembly of claim 1, wherein the width of the additional structure is approximately equal to twice a distance from the structure to a corner of a sidewall of the first aperture.

3. The semiconductor assembly of claim 1, wherein the additional structure has a width of approximately 40 nm or less.

4. The semiconductor assembly of claim 1, wherein the additional structure has a width of approximately 35 nm or less.

5. The semiconductor assembly of claim 1, wherein the first aperture comprises a trench.

6. The semiconductor assembly of claim 1, wherein the additional structure comprises a via.

7. The semiconductor assembly of claim 1, wherein a width of the first aperture is greater than a width of the second aperture.

8. The semiconductor assembly of claim 1, wherein the polymer layer in the first aperture comprises sidewall spacers along the sidewalls of the first aperture.

9. A semiconductor assembly, comprising:
   a dielectric layer;
   a first aperture formed in the dielectric layer, the first aperture having a first width;
   a second aperture formed in the dielectric layer, adjacent the first aperture, the second aperture having a second width narrower than the first width;
   a polymer layer disposed on the dielectric layer and in the first aperture and the second aperture, wherein the polymer layer completely fills the second aperture;
   spacers formed on sidewalls of the first aperture, wherein the spacers are formed from the polymer layer; and
   an additional structure formed through the dielectric layer at a base of the first aperture and having a third width, wherein the first width is wider than the third width.

10. The semiconductor assembly of claim 9, wherein the first aperture has a generally rectangular cross section across a width of the first aperture.

11. The semiconductor assembly of claim 10, wherein a diameter of the additional structure is approximately equal to twice a distance from the closest point of the circumference of the additional structure to a corner of the rectangular first aperture.

12. The semiconductor assembly of claim 9, wherein the additional structure has a diameter of approximately 45 nm or less.

13. The semiconductor assembly of claim 9, wherein the first aperture comprises a trench and the additional structure comprises a via.

14. The semiconductor assembly of claim 13, wherein the second aperture comprises a trench formed parallel to the first aperture.

* * * * *